US012197509B2

(12) United States Patent
Bosshart et al.

(10) Patent No.: US 12,197,509 B2
(45) Date of Patent: *Jan. 14, 2025

(54) ALGORITHMIC TCAM BASED TERNARY LOOKUP

(71) Applicant: Barefoot Networks, Inc., Santa Clara, CA (US)

(72) Inventors: Patrick Bosshart, Plano, TX (US); Michael G. Ferrara, Palo Alto, CA (US); Jay E. S. Peterson, San Francisco, CA (US)

(73) Assignee: Barefoot Networks, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/088,182

(22) Filed: Dec. 23, 2022

(65) Prior Publication Data

US 2023/0127391 A1 Apr. 27, 2023

Related U.S. Application Data

(63) Continuation of application No. 16/383,448, filed on Apr. 12, 2019, now Pat. No. 11,687,594, which is a
(Continued)

(51) Int. Cl.
*G06F 16/903* (2019.01)
*G06F 16/901* (2019.01)
(Continued)

(52) U.S. Cl.
CPC .... *G06F 16/90339* (2019.01); *G06F 16/9017* (2019.01); *G11C 7/1072* (2013.01);
(Continued)

(58) Field of Classification Search
CPC .. G06F 16/90339; G11C 15/00; G11C 7/1072
(Continued)

(56) References Cited

U.S. PATENT DOCUMENTS 7,254,748 B1 8/2007 Wright et al.
7,904,642 B1 * 3/2011 Gupta ............... G06F 16/90339
711/108

(Continued)

OTHER PUBLICATIONS

Examiner's Answer in response to Appeal Brief filed Jul. 6, 2021, for U.S. Appl. No. 16/383,448, dated Sep. 17, 2021.
(Continued)

*Primary Examiner* — Gautam Sain
*Assistant Examiner* — Edward Waddy, Jr.
(74) *Attorney, Agent, or Firm* — Essential Patents Group, LLP; Christopher K. Gagne

(57) ABSTRACT

An algorithmic TCAM based ternary lookup method is provided. The method stores entries for ternary lookup into several sub-tables. All entries in each sub-table have a sub-table key that includes the same common portion of the entry. No two sub-tables are associated with the same sub-table key. The method stores the keys in a sub-table keys table in TCAM. Each key has a different priority. The method stores the entries for each sub-table in random access memory. Each entry in a sub-table has a different priority. The method receives a search request to perform a ternary lookup for an input data item. A ternary lookup into the ternary sub-table key table stored in TCAM is performed to retrieve a sub-table index. The method performs a ternary lookup across the entries of the sub-table associated with the retrieved index to identify the highest priority matched entry for the input data item.

24 Claims, 11 Drawing Sheets

Related U.S. Application Data continuation of application No. 15/094,914, filed on Apr. 8, 2016, now Pat. No. 10,318,587.

(60) Provisional application No. 62/221,071, filed on Sep. 20, 2015.

(51) Int. Cl.
| | |
|---|---|
| *G11C 7/10* | (2006.01) |
| *G11C 11/406* | (2006.01) |
| *H04L 45/74* | (2022.01) |
| *H04L 45/745* | (2022.01) |
| *G11C 15/04* | (2006.01) |

(52) U.S. Cl.
CPC ...... *G11C 11/40615* (2013.01); *H04L 45/742* (2013.01); *H04L 45/74591* (2022.05); *G11C 15/04* (2013.01)

(58) Field of Classification Search
USPC ................. 711/105, 108, 221, 12.001, 104
See application file for complete search history.

(56) References Cited

U.S. PATENT DOCUMENTS

| | | |
|---|---|---|
| 8,687,636 B1 | 4/2014 | Sivan et al. |
| 9,762,261 B2 | 9/2017 | Zampaglione et al. |
| 9,940,191 B2 | 4/2018 | Abali et al. |
| 9,979,651 B2 | 5/2018 | Labonte et al. |
| 10,091,137 B2 | 10/2018 | Tran et al. |
| 2003/0023581 A1 | 1/2003 | Davis et al. |
| 2003/0142525 A1 | 7/2003 | Batson et al. |
| 2004/0032869 A1 | 2/2004 | Ambe et al. |
| 2004/0143701 A1* | 7/2004 | Giambalvo ............ G11C 15/00 711/108 |
| 2007/0022479 A1 | 1/2007 | Sikdar et al. |
| 2009/0041017 A1 | 2/2009 | Luk |
| 2011/0255540 A1 | 10/2011 | Mizrahi et al. |
| 2013/0246698 A1* | 9/2013 | Estan .................. G11C 7/1072 711/108 |
| 2014/0268972 A1 | 9/2014 | Bosshart |
| 2014/0328180 A1 | 11/2014 | Kim et al. |
| 2014/0334489 A1 | 11/2014 | Bosshart et al. |
| 2015/0039823 A1* | 2/2015 | Chen ................ G06F 16/90339 711/108 |
| 2016/0182372 A1 | 6/2016 | Holbrook et al. |
| 2016/0254999 A1 | 9/2016 | Labonte et al. |
| 2016/0283317 A1 | 9/2016 | Abali et al. |
| 2017/0195253 A1 | 7/2017 | Annaluru et al. |
| 2017/0237662 A1 | 8/2017 | Labonte et al. |
| 2018/0241673 A1 | 8/2018 | Labonte et al. |

OTHER PUBLICATIONS

Notice of Allowance for U.S. Appl. No. 15/094,914 dated Mar. 6, 2019.
Office Action for U.S. Appl. No. 15/094,914, dated Mar. 22, 2018.
Office Action for U.S. Appl. No. 15/094,914, dated Nov. 2, 2018.
Office Action for U.S. Appl. No. 16/383,448, dated Aug. 25, 2022.
Office Action for U.S. Appl. No. 16/383,448, dated Feb. 5, 2020.
Office Action for U.S. Appl. No. 16/383,448, dated Sep. 18, 2020.
Bosshart, P., et al., "Forwarding Metamorphosis: Fast Programmable Match-Action Processing in Hardware or SDN", SIGCOMM'13, Aug. 12-16, 2013, 12 pages, ACM, Hong Kong, China.
Notice of Allowance for U.S. Appl. No. 16/383,448, dated Feb. 28, 2023.

\* cited by examiner

400

| 001* |
| 001001* |
| 001011* |
| 011* |
| 01101* |
| 011011* |
| 10* |
| 1010* |
| 10110* |
| 101101* |
| 111* |
| 1111* |
| 11110* |

*Fig. 4*

ALGORITHMIC TCAM BASED TERNARY LOOKUP

CLAIM OF BENEFIT TO PRIOR APPLICATIONS

This application is a continuation of prior U.S. patent application Ser. No. 16/383,448, filed Apr. 12, 2019, entitled "Algorithmic TCAM Based Ternary Lookup", which is a continuation of prior U.S. patent application Ser. No. 15/094,914, filed Apr. 8, 2016, entitled "Algorithmic TCAM Based Ternary Lookup", now U.S. Pat. No. 10,318,587, which claims the benefit of prior U.S. Provisional Patent Application No. 62/221,071, filed Sep. 20, 2015. Each of these prior applications is hereby incorporated herein by reference in its entirety.

BACKGROUND

In traditional computer memory such as random access memory (RAM) the address of data is used to retrieve content stored in the memory. Searching to determine whether a table stored in RAM includes a particular value would require repeatedly retrieving the content stored in different memory addresses, comparing the content with the value, and repeating memory accesses until either a match is found or it is determined that the table does not store the particular value.

In contrast, content-addressable memory (CAM) uses a data word to search the contents of the entire memory to determine whether the word is stored anywhere in memory. CAM allows searching the memory based on the stored content. A table stored in CAM is searched in parallel to determine whether a particular content value matches any table entries stored in memory and when one or more matches are found CAM returns a list of the storage addresses where a match is found.

In binary CAM, each bit of stored data corresponds to a binary state of 0 or 1. Ternary content-addressable memory (TCAM) allows an additional state of "don't care" or "wildcard," represented as "X". For instance, an 8-bit TCAM can store a value of 01101XXX, which matches any of the values 01101000, 01101001, 01101010, 01101011, 01101100, 01101101, 01101110, and 01101111.

The use of the wildcard state allows fewer entries stored in TACM. A typical application of TCAMs is in networking equipment such as a router where each address has two parts: a network address that varies in size depending on the sub-network configuration and a host address that uses the remaining bits in the address. The router maintains a routing table that includes don't care for the host address portion of the addresses. Each entry has a corresponding priority. The routing table also stores the routing information corresponding for each stored entry. Looking up the TCAM against a network address in an incoming packet results in the corresponding routing information. TCAM hardware compares the incoming value against all entries in the table in parallel. TCAM hardware returns the matching results for the highest priority entry.

Due to the parallel nature of TCAM, searching for content stored in TCAM is much faster than traditional RAM. However, implementing TCAM requires additional hardware components to perform parallel search, as well as masking, comparison, and priority determination. As a result, TCAM is more expensive than traditional memory, consumes more power, and generates more heat that has to be dissipated.

BRIEF SUMMARY

Some embodiments provide an algorithmic TCAM based ternary lookup method. The method groups data items based on a common portion of each unmasked data item. The data is divided into several non-overlapping prioritized sub-tables (or partitions). All entries in each sub-table exclusively share a common portion of their unmasked content referred to as sub-table key. The data for the sub-tables are stored in random access memory such as static random-access memory (SRAM) or dynamic random access memory (DRAM). The sub-tables keys and the associated masks are stored in a ternary sub-table keys table.

When a ternary lookup is required to match an input value, the value is matched against the entries in the ternary sub-table keys table stored in TCAM to retrieve the sub-table index. The TCAM hardware searches the entries of the ternary sub-table keys table in parallel and returns the sub-table index associated with the highest priority match. The sub-table index is used to identify a sub-table stored in random access memory. A ternary lookup into the identified sub-table stored in random access memory such as SRAM is performed to find the highest priority match.

Storing only the sub-table indexes and the associated masks in TCAM reduces the need to store all search entries in TCAM. The algorithmic TCAM based ternary lookup method is applicable to any application such as longest prefix match and access control lists (ACLs) that can benefit from ternary lookup.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawings.

BRIEF DESCRIPTION OF THE DRAWINGS

The novel features of the invention are set forth in the appended claims. However, for purposes of explanation, several embodiments of the invention are set forth in the following figures.

FIG. 4 conceptually illustrates an example of a longest prefix match (LPM) table.

DETAILED DESCRIPTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Figure 1:
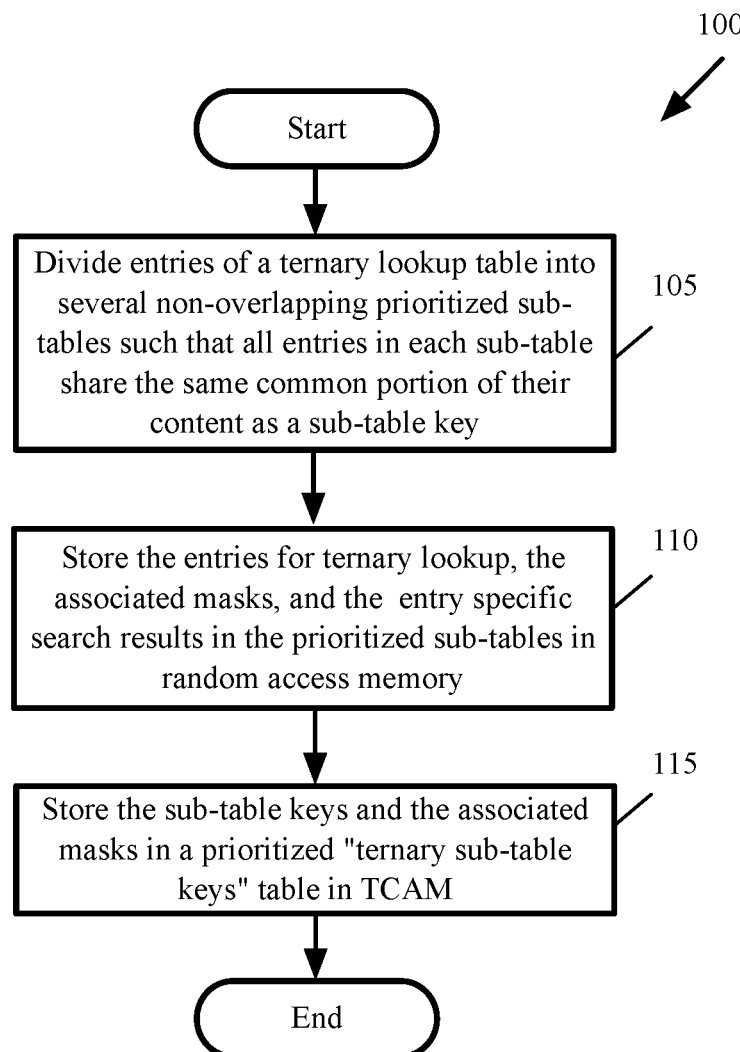
FIG. 1 conceptually illustrates a process for storing data for ternary lookup in TCAM and random access memory in some embodiments of the invention.

FIG. 1 conceptually illustrates a process 100 for storing data for ternary lookup in TCAM and random access memory in some embodiments of the invention. As shown, the process divides (at 105) entries of a ternary lookup table into several non-overlapping prioritized sub-tables (or partitions) such that all entries in each sub-table share the same common portion of their content as a sub-table key.

The process stores (at 110) the entries for ternary lookup, the entries' associated masks, and the entry specific search results in the prioritized search tables in random access memory. The mask is used to implement ternary values where each bit can have a value of 0, 1, or don't care. The entry specific search result associated with each entry is the result that is returned by a ternary lookup process when the entry is the highest priority entry that matches the input data in a search request. The process then stores (at 115) the sub-table keys and the associated masks in a "ternary sub-table keys" table in TCAM. The mask for each entry is used to implement ternary values where each bit can have a value of 0, 1, or don't care. The process then ends.

Figure 2:
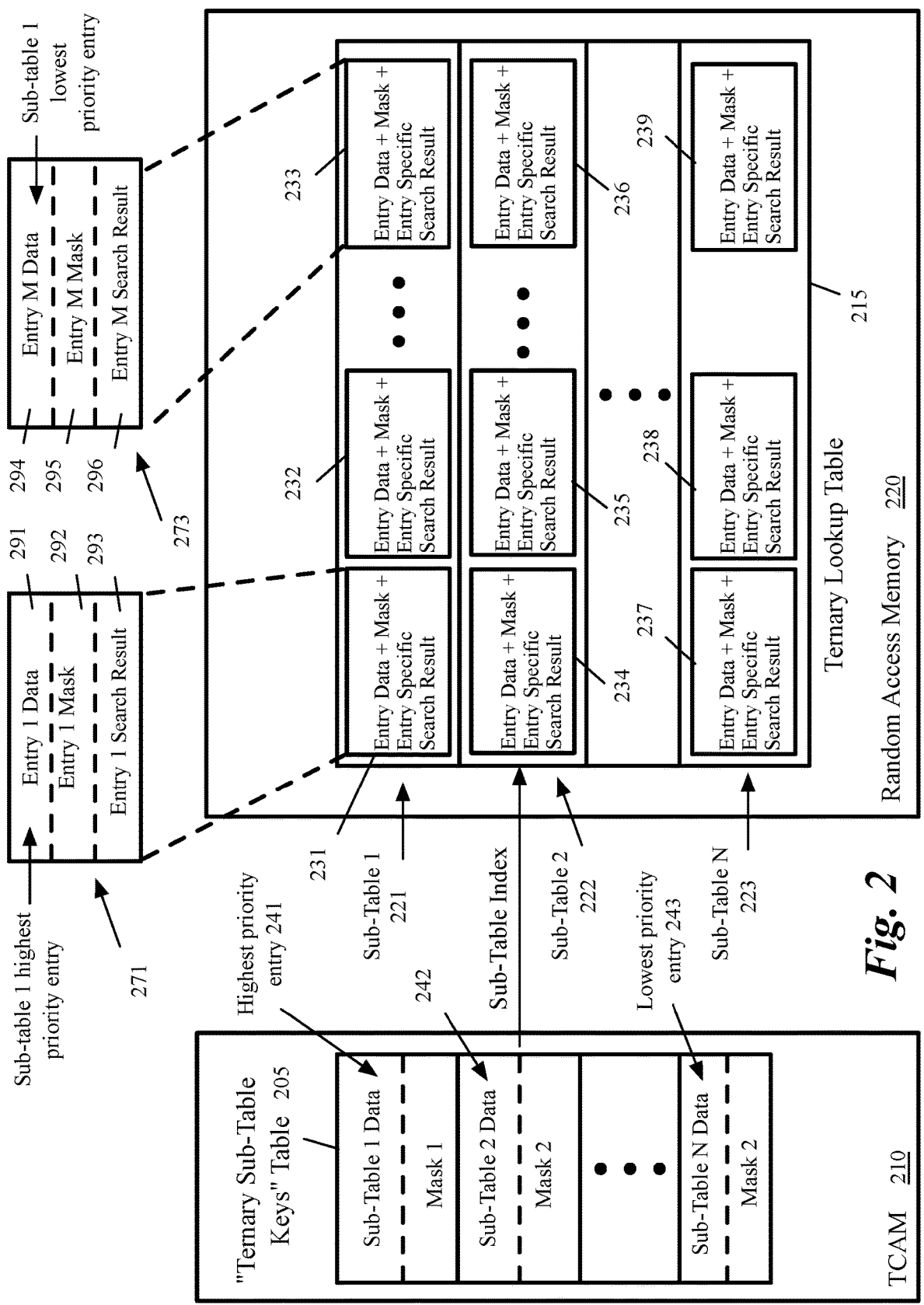
FIG. 2 conceptually illustrates data for ternary lookup that is broken into a table that stores ternary sub-table indexes in TCAM and a table that includes a set of ternary lookup sub-tables stored in random access memory in some embodiments of the invention.

FIG. 2 conceptually illustrates data for ternary lookup that is broken into a table that stores ternary sub-table indexes in TCAM and a table that includes a set of ternary lookup sub-tables stored in random access memory in some embodiments of the invention. As shown, the sub-table keys and the associated masks in ternary sub-table keys table (also referred to as a ternary sub-table classifier table) 205 are stored in TCAM 210. In some embodiments, the entries in the ternary sub-table keys table are stored in based on their priorities (e.g., the first entry has the highest, followed by the next highest priority entry, and ending to the least priority entry). Whenever a search in a sub-table results in more than one match, the entry with the highest priority is returned as the search result. For instance, entry 241 has the highest priority followed by entry 242, while entry 243 has the lowest priority.

Unlike the ternary sub-table keys table, table 215 that includes ternary lookup sub-tables 221-223 is stored in random access memory 220 such as SRAM. Each sub-table 221-223 includes one or more entries 231-239. Each entry includes data, the associated mask, and entry specific data. Each sub-table entry is also associated with a priority. In some embodiments, the sub-tables are stored in random access memory based on their priorities (e.g., the first entry has the highest, followed by the next highest priority entry, and ending to the least priority entry). Whenever a search in a sub-table results in more than one match, the entry with the highest priority is returned as the search result. For instance, in Sub-table 221, entry 231 has the highest priority followed by entry 232, while entry 233 has the lowest priority.

As shown in the expanded view 271 for entry 231, the entry includes data 291, mask 292, and entry specific search result 293. Similarly, the expanded view 273 for entry 233 shows that the entry includes data 294, mask 295, and entry specific search result 296.

Figure 3:
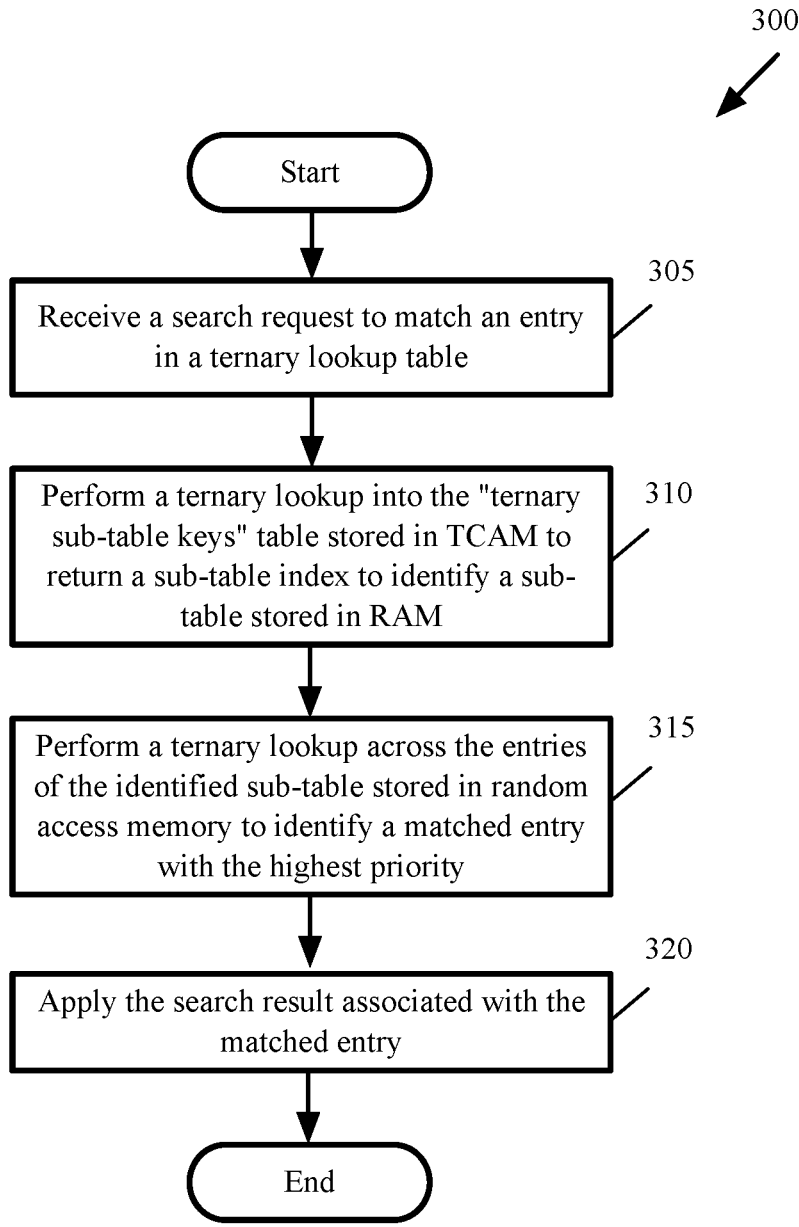
FIG. 3 conceptually illustrates a process for performing a ternary lookup in some embodiments of the invention.

FIG. 3 conceptually illustrates a process 300 for performing a ternary lookup in some embodiments of the invention. Ternary lookup is referred to a lookup that receives an input search value that can include bits with 0, 1, or don't care values and matches the input value against the masked values of a ternary table. The masked value for each entry is the determined by applying the mask associated with each entry to the entry to come with a masked value that can have bits with values of 0, 1, or don't care.

As shown, the process receives (at 305) a search request to match an entry in a ternary lookup table. The process performs (at 310) a ternary lookup into the ternary sub-table keys table stored in TCAM to retrieve a sub-table index to identify a sub-table in RAM. The TCAM hardware searches the entries in parallel and returns the sub-table index associated with the highest priority match. The sub-table index is used to identify a sub-table in the ternary lookup sub-tables stored in random access memory.

In the example of FIG. 2, the entries (and the associated masks) in the ternary sub-table keys table 205 are stored according to the entry priorities with the $1^{st}$ entry being the highest priority entry. Applying each mask to the associated entry results in a key. Therefore, if the highest priority key that matches the search criteria is the $n^{th}$ entry of the table, the sub-table index value returned by the search is "n". This indicates that the $n^{th}$ sub-table has all entries associated with the $n^{th}$ key in the ternary sub-table keys table. The $n^{th}$ sub-table is, therefore, the only sub-table that needs to be searched to find the final search result.

The process then performs (at 315) a ternary lookup into the identified sub-table that is stored in RAM to find the highest priority match. The process then applies (at 320) the search result associated with the matched entry. In some embodiments, a set of processing units or other specialized hardware of a computing system that implements the ternary lookup performs the search of the identified sub-table. The process then ends. Several examples for utilizing processes 100 and 300 for performing ternary lookups for different applications are described below.

FIG. 4 conceptually illustrates an example of a longest prefix match (LPM) table 400. LPM is an algorithm commonly used by routers to select an entry in a forwarding table. For simplicity, the network address in the example of FIG. 4 has only 8 bits. One of ordinary skill in the art will realize that the example can easily be extended to other protocols such as Internet Protocol version 4 (IPv4) that uses 32-bit addresses and Internet Protocol version 6 (IPv6) that uses 128-bit addresses.

The example of FIG. 4 shows prefixes for a network that is divided into 13 logical sub-networks. A sub-network is a logical subdivision of an IP network. The IP addresses are divided into two fields: a network (or routing) prefix and a host identifier (also referred to as a rest field). The network prefix is the most significant portion of the IP address and identifies where a device is connected (e.g., identifies a router at the edge or the entry point of a network). The host identifier identifies who the host is (e.g., identifies an individual device or interface on a particular network). All devices in the same network (or subnet) have the same network prefix.

In FIG. 4, the network prefixes of each sub-network is shown in binary followed by * to dente the host identifier field. Another way of expressing network prefixes is using a classless inter-domain routing (CIDR) notation, which expresses the network prefix followed by a slash character ("/"), followed by the length of the prefix in bits.

A forwarding table maps the network prefixes to a router's ports and is used to forward packets received at the router to the port where the next destination network device (or the packet's next hop) resides. When there are multiple overlapping routes for a destination, the router chooses the most specific route, i.e., the route with the longest prefix. For instance if 190.12.5.0/26 and 190.12.0.0/16 both match, the router chooses the /26 address. Ternary lookup handles this by using don't care bits to ignore the bits associated with the host address portion of the destination IP address. The most specific routes in an LPM table are given higher priorities. The forwarding tables can also include a default next hop to fall back if no other table entries results in a match.

Figure 5:
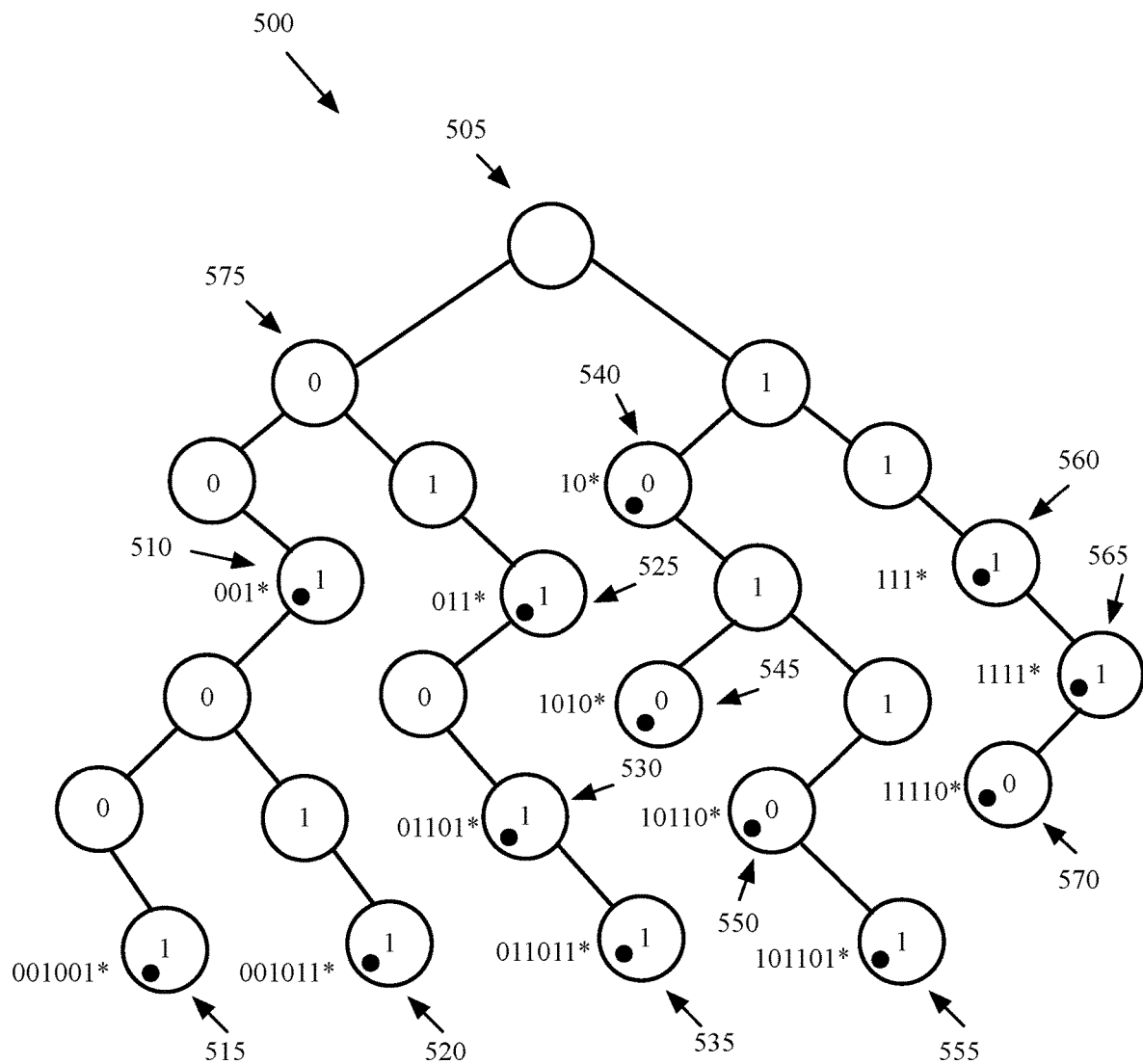
FIG. 5 conceptually illustrates the corresponding 1-bit trie (or prefix tree) for the LPM table of FIG. 4.

FIG. 5 conceptually illustrates the corresponding 1-bit trie (or prefix tree) 500 for the LPM table of FIG. 4. A prefix tree is an ordered tree data structure where the position of a node in the tree defines the key with which the node is associated. In a prefix tree, all descendants of a node have a common prefix of the string (or digit) associated with that node and the root is associated with the empty string (or Null value).

In FIG. 5, each node in the tree other than the root node 505 is associated with a digit 0 or 1. Although, it is not required for the keys to be stored in the nodes, FIG. 5 conceptually shows the values associated with each node inside the node. The root node 505 is associated with empty a Null value and each node in the tree is associated with an extra 0 or 1 bit than the parent. In the example of FIG. 5, the left child has an extra 0 and the child on the right has an extra 1 bit than the parent. The unspecified bits of each node are shown by * to indicate don't care. For instance, node 510 is associated with value 001* and node 540 is associated with value 10*.

The nodes 510-570 (which are marked with a black dot) are the nodes associated with the entries of LPM table 400 in FIG. 4. The LPM table values associated with each node 510-570 are shown on the left of each node. Since the IP addresses in the example of FIG. 4 have 8-bits, a * character at the end of each value indicate the "rest" field (or don't care bits) in each IP address.

Figure 6:
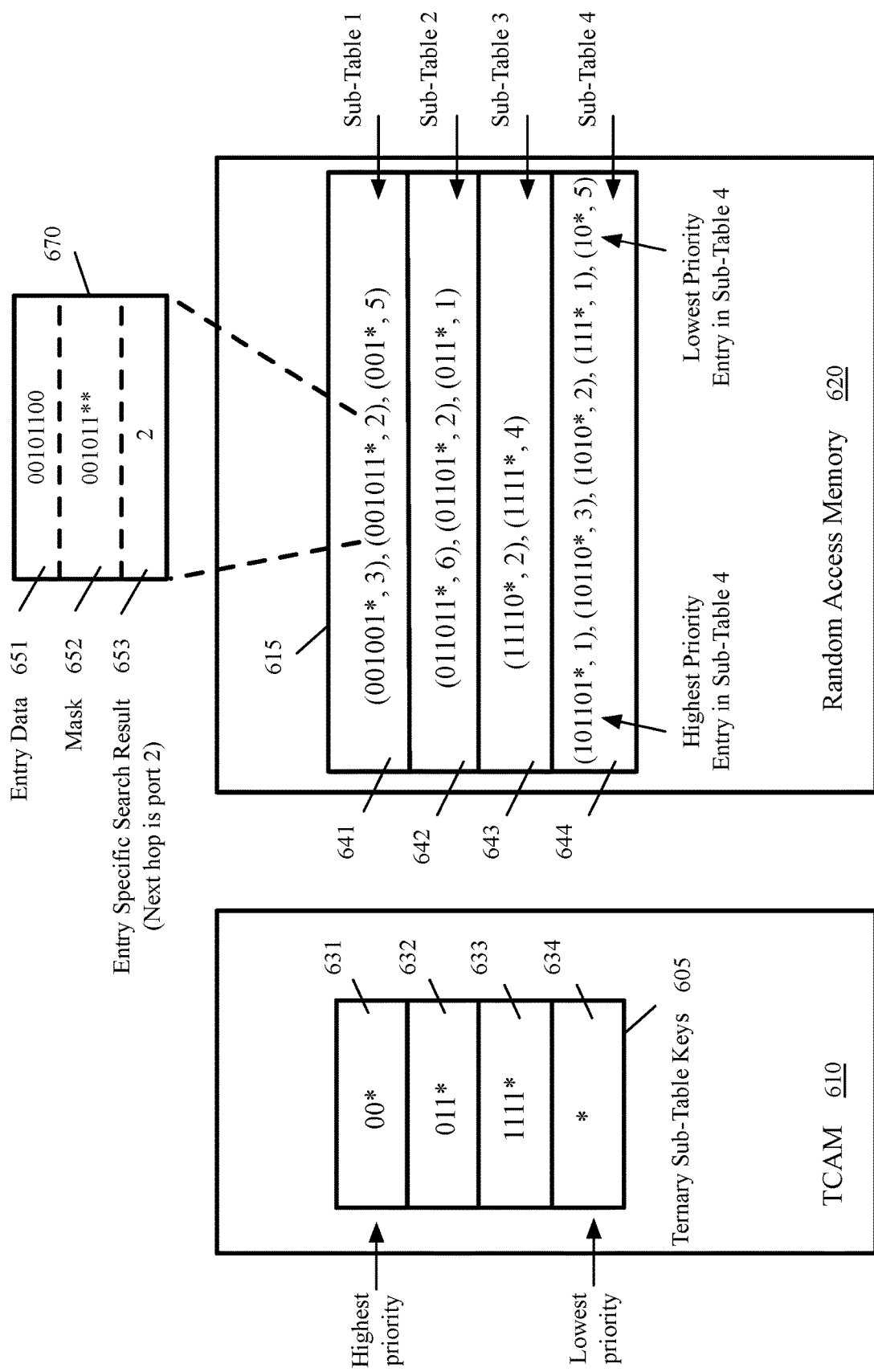
FIG. 6 conceptually illustrates the entries of table of FIG. 4 partitioned into two tables.

FIG. 6 conceptually illustrates the entries of table 400 of FIG. 4 divided into four sub-tables 641-644. In addition, table 605 stores the sub-table keys and the associated masks (conceptually shown together as a numeric value followed by a *). Table 605 is a ternary sub-table keys table, which is stored in TCAM 610. As shown, table 605 includes 4 sub-table keys 631-634 with values 00*, 011*, 1111*, and *.

Table 615 stores the entries for the 4 sub-tables 641-644 associated with each sub-table key. Table 615 is stored in random access memory such as SRAM or DRAM. As shown in the expanded view 670 for the second entry of sub-table 641, the entry includes data 651, a mask 652, and an entry-specific search result 653, which is returned as the search result if the entry is the highest priority entry that matches a searched input. In this example, the entry data is 00101100, the associated mask is 001011, and the entry-specific search result is port 2. Applying the mask to the entry data results in the masked value 001011. For convenience, the sub-table 641-644 entries are shown as two tuples (a masked value and the search result).

Each of the entries in a sub-table 641-644 is associated with a priority. The priorities are conceptually shown in FIG. 6 by sorting the entries from left to right based on their priorities. For instance, entry 011011* in sub-table 642 has the highest priority in that sub-table followed by 01101* entry, followed by 011* entry. The sub-tables 641-644 can include different number of entries. For instance, sub-table 643 has 2 entries while sub-table 644 has 5 entries.

Figure 7:
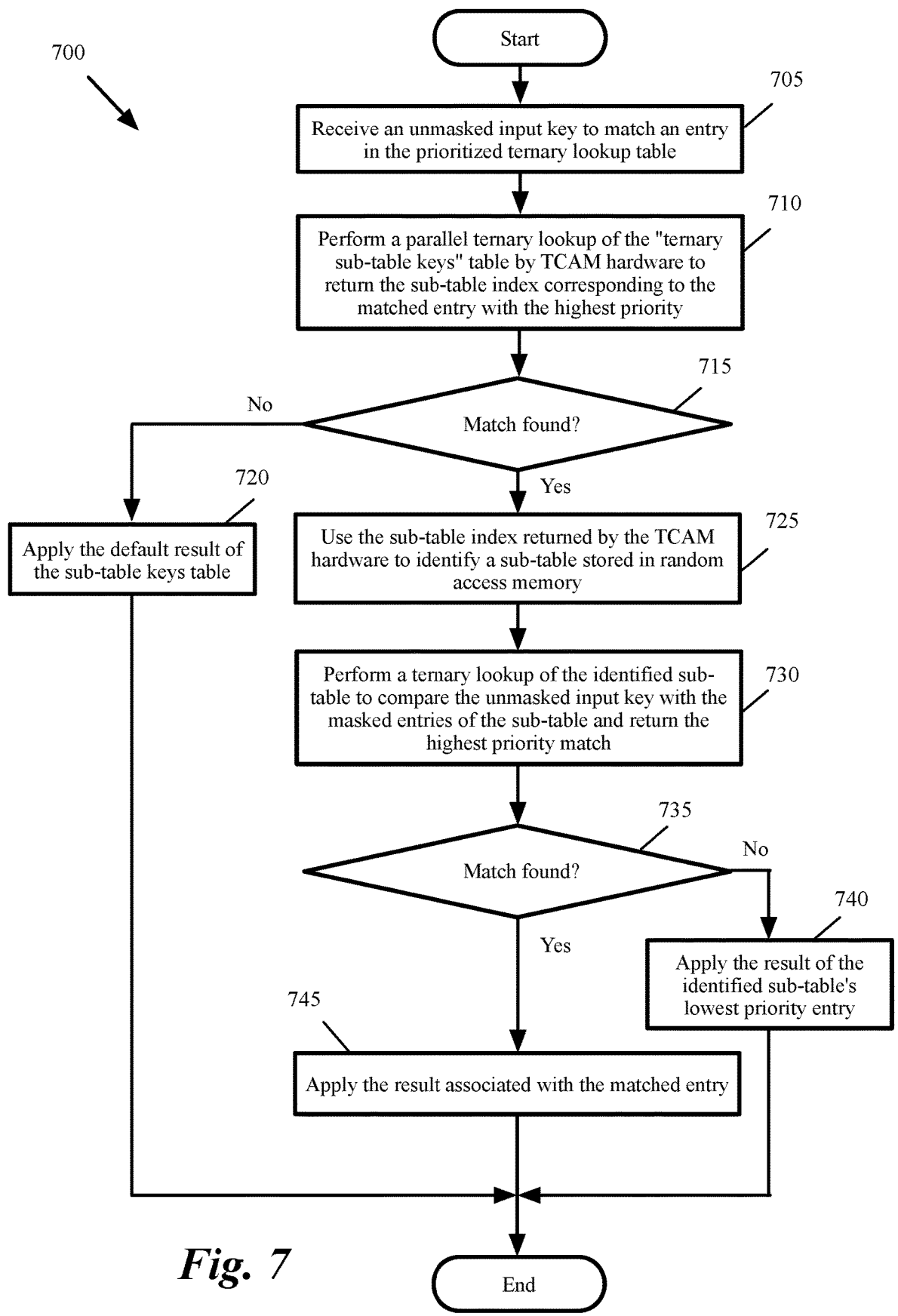
FIG. 7 conceptually illustrates a process for performing a ternary look up to match an input key using the two tables of FIG. 6.

FIG. 7 conceptually illustrates a process 700 for performing a ternary look up to match an input key using the two tables 605 and 615 of FIG. 6. Although FIG. 6 was described for the example of an LPM table, process 700 is general and is applicable to any application that utilizes the disclosed algorithmic TCAM based ternary lookup. As shown, the process receives (at 705) an unmasked input key to match an entry in the ternary lookup table (which is divided into several sub-tables). The input key can, for example, be a field in an incoming packet received at a router that specifies the destination IP address for the packet. The input key can, for example, be a field in an incoming packet at a firewall that has to be matched against a set of rules.

The process then performs (at 710) a parallel ternary lookup in the sub-table keys table by the TCAM hardware to return the sub-table index corresponding to the match with the highest priority. The process determines (at 715) whether a match was found by the TCAM ternary lookup. When a match is not found, the process applies (at 720) a default result of the sub-table keys table. For example, the process identifies a default router port as the next hop for an incoming packet. The process then ends. Otherwise, the process uses (at 725) the sub-table index returned by the TCAM hardware to identify a sub-table stored in random access memory to continue the search.

Figure 8:
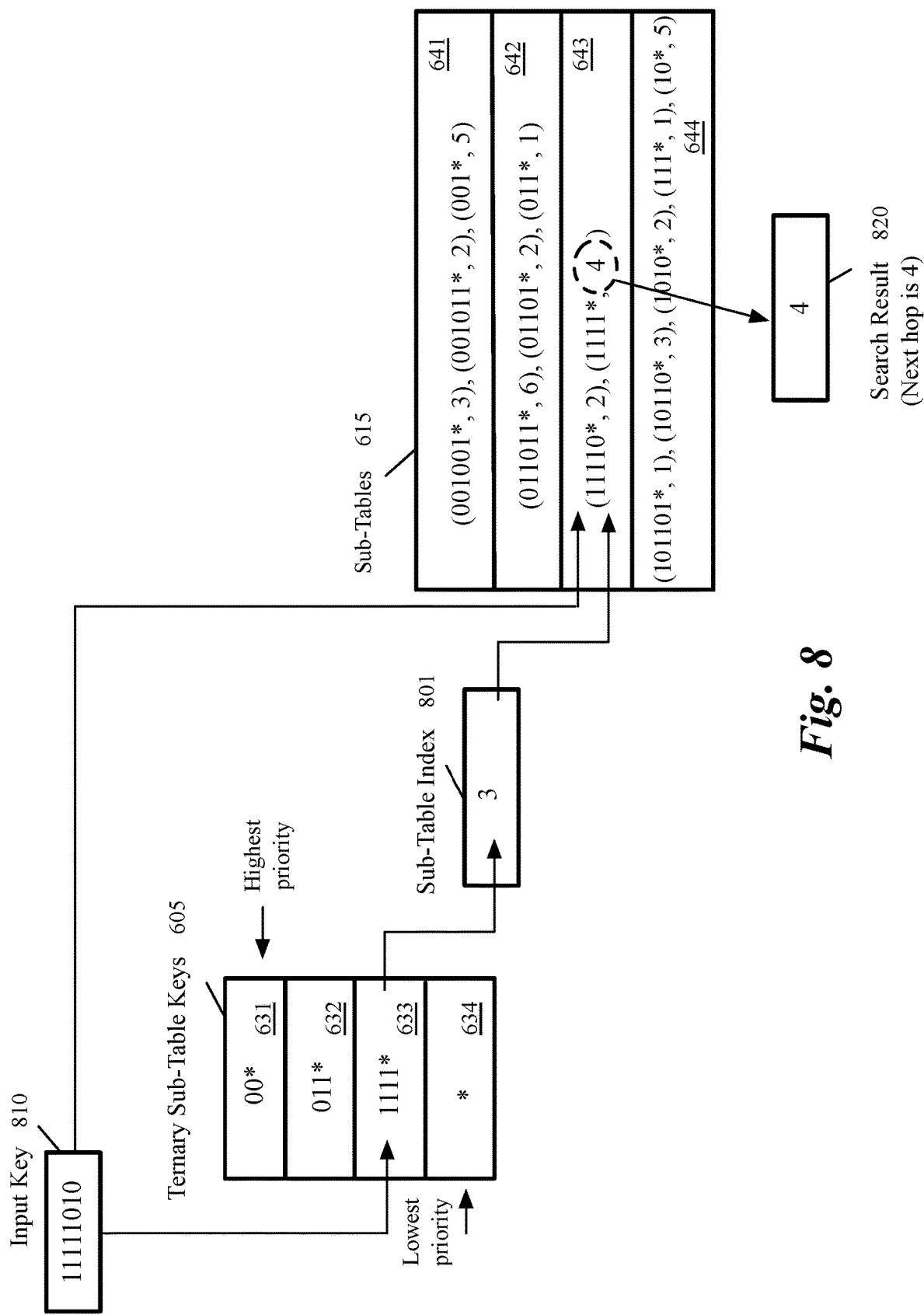
FIG. 8 provides an example of the data structures used by process to perform the ternary lookup.

FIG. 8 provides an example of the data structures used by process 700 to perform the ternary lookup for an LPM search. The 4 sub-table keys 631-634 are associated with 4 sub-table indexes. In the example of FIG. 8, the entries in the ternary sub-table keys table are stored in based on their priorities (i.e., the first entry has the highest, followed by the next highest priority entry, and ending to the least priority entry. Whenever a search in a sub-table results in more than one match, the entry with the highest priority is returned as the search result.

Therefore, if the highest priority key that matches the search criteria is the $n^{th}$ entry of the table 605 in FIG. 8, the sub-table index value returned by the search is "n". This indicates that the $n^{th}$ sub-table has all entries associated with the $n^{th}$ key in the ternary sub-table keys table. The $n^{th}$ sub-table is, therefore, the only sub-table that needs to be searched to find the final search result. In the example of FIG. 8, the sub-table indexes associated with the table entries 631-634 are 1-4, respectively (or 0-3 if the table indexes start from 0 instead of 1). Each sub-table index identifies an associated sub-table 641-644.

In the example of FIG. 8, an unmasked key 810 (e.g., a field specifying the destination IP address of a packet) is received at a router that uses tables 605 and 615 to implement an LPM table. As shown, the destination IP address is 11111010. The destination address is used by TCAM hardware to search in table 605, which is stored in TCAM. The search produces two matches, sub-table key 633 with value of 1111* and sub-table key 634 with value of *. Since sub-table key 633 has a higher priority, sub-table index 801 associated with sub-table key 633 is identified as the sub-table index. Sub-table index 801 has a value of 3. This value is used to identify sub-table 643 to search for an entry to match the input key 11111010 810.

Figure 9:
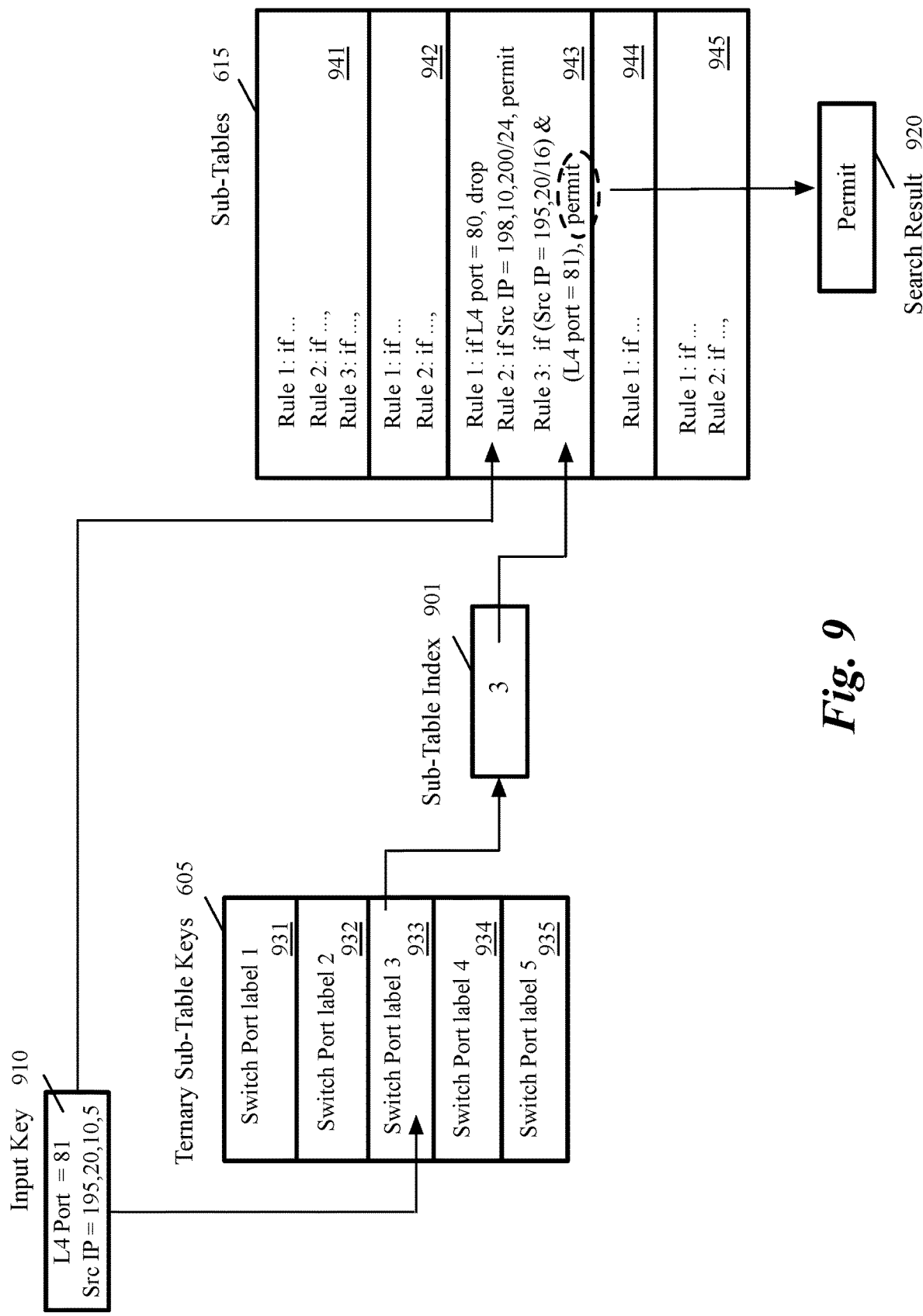
FIG. 9 illustrates an example of the application of the algorithmic TCAM based ternary lookup in some embodiments of the invention.

FIG. 9 provides another example of the data structures used by process 700 to perform the ternary lookup into firewall access control list (ACLs). As shown in FIG. 9, 5 sub-table keys 931-935 are associated with 5 sub-table indexes. In the example of FIG. 9, a lower sub-table index is associated with a higher priority sub-table key. The sub-table keys are used to identify the corresponding sub-table 941-945.

In the example of FIG. 9, an unmasked input key 910 (e.g., a set of fields in a packet) is received at a firewall that uses tables 605 and 615 to enforce a set of rules. As shown, the input key includes fields that specify an Open Systems Interconnection (OSI) model layer 4 port and a source IP address. In this example, the layer 4 port is port 81 and the source IP address is a 32-bit IPv4 address 195,20,10,5. The layer 4 port and the source IP address of the packet is used by the firewall to enforce different rules.

In the example of FIG. 9, the ternary sub-table keys table 605 includes the port label for the network switch port that has received the packet. For instance, the network switch may have 16 ports. The 16 ports in the example of FIG. 9 are divided into 5 groups (or port labels) 931-935. Switch port label 1 931 may include switch ports 1, 8, and 12 while switch port label 2 932 may include switch ports 2, 9, 11, and 13.

The input key is used by TCAM hardware to search in table 605, which is stored in TCAM. In this example, the packet 910 is received at one of the port switches in switch port label 3 933. As a result, sub-table index 901 is identified as the sub-table index. Sub-table index 901 has a value of 3. This value is used to index into ternary lookup table sub-tables 615 to identify sub-table 943 as the sub-table to search to find an entry for the input key 910.

Referring back to FIG. 7, the process performs (at 730) a ternary lookup of the identified sub-table to compare the unmasked input key with the masked entries of the identified sub-table and return the search result associated with the highest priority match. The ternary lookup includes performing a lookup to match values that includes a set of bits that can include 0, 1, and don't care. The process then determines at (735) whether a match was found. When a match is not found, the process applies (at 740) the result of the identified sub-table's lowest priority entry. For example, the process identifies a router port associated with the identified sub-table's lowest priority entry as the next hop for an incoming packet. The process then ends.

Otherwise, the process uses (at 745) the sub-table entry found by the ternary search of the identified sub-table (which is stored in random access memory) as the match for the input key.

Referring back to FIG. 8, the third sub-table 643 has two entries. For simplicity, the entries are shown after the corresponding masks are applied. The masked entries in this example are 11110* and 1111*. The destination address 810 is matched against the two entries of sub-table 643. The destination address matches the lower priority entry 1111*. The search result 820 associated with this entry is returned as the router port for sending the packet to the next hop towards the destination sub-network. In this example, port 4 is the port returned as the search result 820.

In the example of FIG. 9, the third sub-table 943 has three rules (Rules 1 to 3). Each rule has a set of criteria to match and an action to perform if there is a match. For instance, Rule 1 indicates that if the layer 4 port is port 80, the packet received at the firewall has to be dropped. Rule 2 indicates that if the source IP address is 198,10,200/24, the packet is permitted. Rule 3 indicates that if the source IP is 195,20/16 and the layer 4 port is 81, the packet is permitted.

Figure 10:
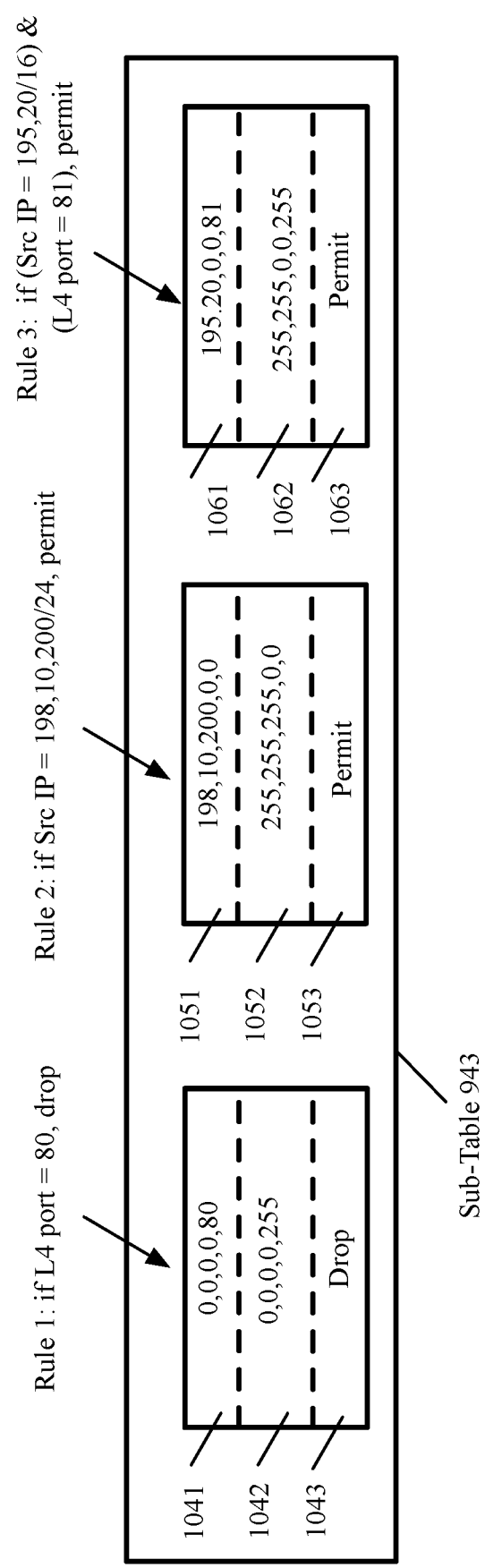
FIG. 10 conceptually illustrates an example of storing the rules of sub-table of FIG. 9.

FIG. 10 conceptually illustrates an example of storing the rules of sub-table 943 of FIG. 9. Rule 1 is stored in three entries 1041-1043, rule 2 is stored in three entries 1051-1053, and Rule 3 is stored in three entries 1061-1063. The first entry for each rule conceptually shows 5 decimal values separated by commas. The first 4 values specify the source IP address (if any). The fifth value identifies a layer 4 port (if any) associated with the rule. The second entry is the associated mask.

Entries 1041 and 1042 indicate that Rule 1 is only concerned with layer 4 port 80 (the mask 1042 makes the first 4 values associated with the source IP address don't care). Entries 1051 and 1052 indicate that Rule 2 is only concerned with a 24 bit source IP address. The lower 8 bits of the IP address and the layer 4 port value are masked by 0's in the mask 1052.

Entries 1061 and 1062 indicate that Rule 3 is concerned with the 16 bit sub-network portion of the IP address 194,20/16 and the layer 4 port 80 (the mask 1062 makes the lowest 16 bits associated with the source IP address don't care). The search results associated with Rules 1-3 are drop 1043, permit 1053, and permit 1063.

The input key 910 in FIG. 9 is matched against the three entries of sub-table 943. The input key matches the lowest priority entry. The result 920 (i.e., "permit") is returned as the rule to be enforced by the firewall.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 11:
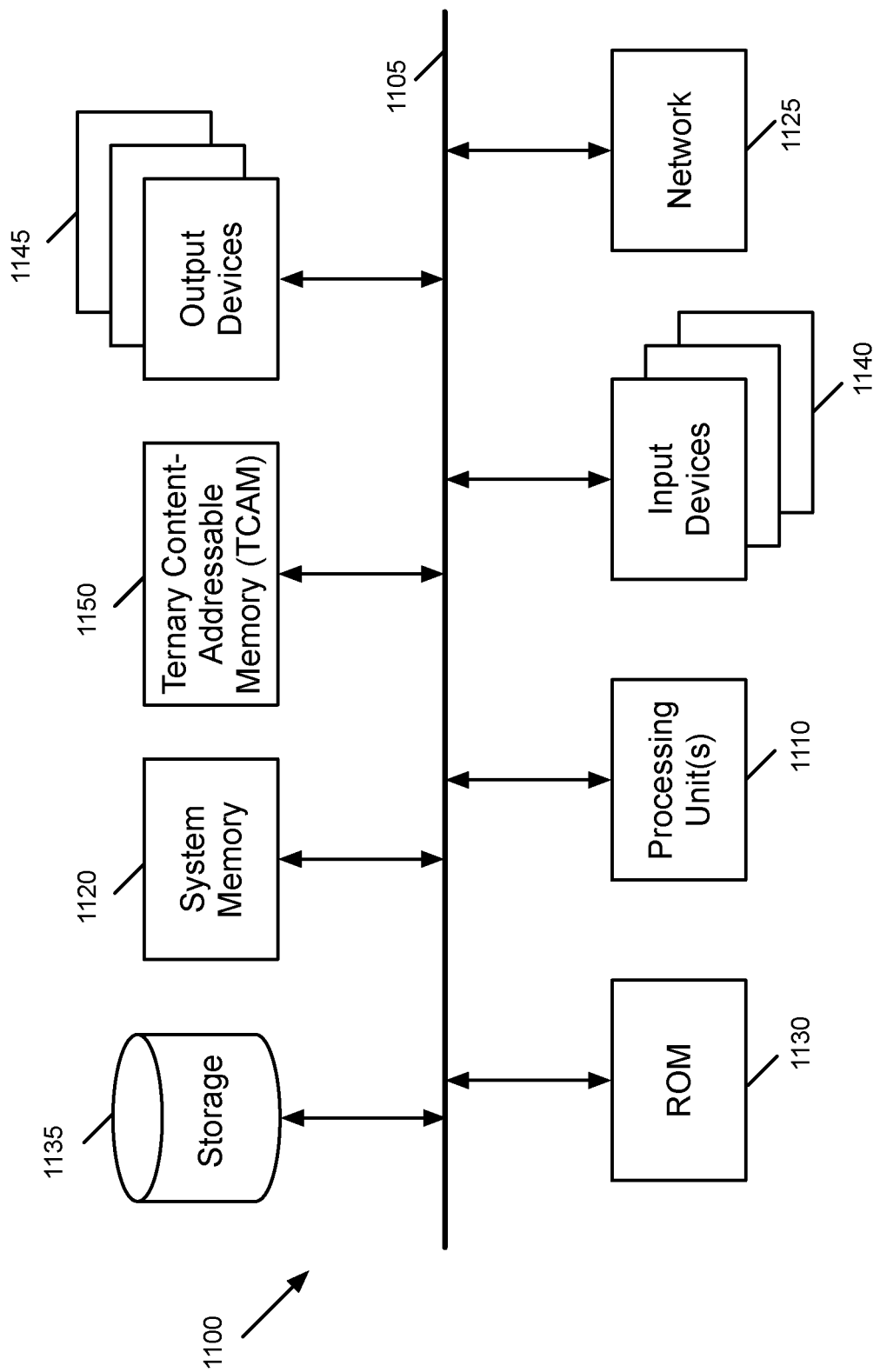
FIG. 11 conceptually illustrates an electronic system with which some embodiments of the invention are implemented.

FIG. 11 conceptually illustrates an electronic system 1100 with which some embodiments of the invention are implemented. The electronic system 1100 can be used to execute any of the control, virtualization, or operating system applications described above. The electronic system 1100 may be a computer (e.g., a desktop computer, personal computer, tablet computer, server computer, mainframe, a blade computer etc.), phone, PDA, or any other sort of electronic device. Such an electronic system includes various types of computer readable media and interfaces for various other types of computer readable media. Electronic system 1100 includes a bus 1105, processing unit(s) 1110, system memory 1120, read-only memory (ROM) 1130, permanent storage device 1135, input devices 1140, output devices 1145, and TCAM 1150.

The bus 1105 collectively represents all system, peripheral, and chipset buses that communicatively connect the numerous internal devices of the electronic system 1100. For instance, the bus 1105 communicatively connects the processing unit(s) 1110 with the read-only memory 1130, the system memory 1120, and the permanent storage device 1135.

From these various memory units, the processing unit(s) 1110 retrieve instructions to execute and data to process in order to execute the processes of the invention. The processing unit(s) may be a single processor or a multi-core processor in different embodiments.

The read-only-memory 1130 stores static data and instructions that are needed by the processing unit(s) 1110 and other modules of the electronic system. The permanent storage device 1135, on the other hand, is a read-and-write memory device. This device is a non-volatile memory unit that stores instructions and data even when the electronic system 1100 is off. Some embodiments of the invention use a mass-storage device (such as a magnetic or optical disk and its corresponding disk drive) as the permanent storage device 1135.

Other embodiments use a removable storage device (such as a floppy disk, flash drive, etc.) as the permanent storage device. Like the permanent storage device 1135, the system memory 1120 is a read-and-write memory device. However, unlike storage device 1135, the system memory is a volatile read-and-write memory, such as random access memory. The system memory stores some of the instructions and data that the processor needs at runtime. In some embodiments, the invention's processes are stored in the system memory 1120, the permanent storage device 1135, and/or the read-only memory 1130. From these various memory units, the processing unit(s) 1110 retrieve instructions to execute and data to process in order to execute the processes of some embodiments.

The bus 1105 also connects to the input and output devices 1140 and 1145. The input devices enable the user to communicate information and select commands to the electronic system. The input devices 1140 include alphanumeric keyboards and pointing devices (also called "cursor control devices"). The output devices 1145 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 11, bus 1105 also couples electronic system 1100 to a network 1125 through a network adapter (not shown). In this manner, the computer can be a part of a network of computers (such as a local area network ("LAN"), a wide area network ("WAN"), or an Intranet, or a network of networks, such as the Internet. Any or all components of electronic system 1100 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral or transitory signals.

While the invention has been described with reference to numerous specific details, one of ordinary skill in the art will recognize that the invention can be embodied in other specific forms without departing from the spirit of the invention. In addition, a number of the figures (including FIGS. 1, 3, and 7) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process.

In view of the foregoing, one of ordinary skill in the art would understand that the invention is not to be limited by the foregoing illustrative details, but rather is to be defined by the appended claims.

What is claimed is:

1. Integrated circuit for use in performing packet forwarding-related operations related to incoming packet data, the integrated circuit being configurable to use machine-readable tertiary content addressable memory (TCAM) in association with the packet forwarding-related operations, the integrated circuit comprising:

other machine-readable memory for use in the packet forwarding-related operations, the machine-readable TCAM and the other machine-readable memory to store table data for use in the packet forwarding-related operations; and at least one processing unit to execute compiler-produced program instructions, the compiler-produced program instructions, when executed by the at least one processing unit resulting in the integrated circuit being configured to perform the packet forwarding-related operations, the packet forwarding-related operations being configurable to comprise:
  performing parallel table lookup operations to determine multiple entries in the table data that match, at least in part, at least one portion of the incoming packet data;
  selecting, based upon relative priorities associated with the multiple entries, one of the multiple entries that corresponds to a highest one of the relative priorities; and
  based upon the one of the multiple entries, determining at least one action to be executed in relation to the incoming packet data;
  wherein:
    the table data is configurable to comprise multiple table data partitions;
    at least one of the multiple table data partitions is configurable to indicate, at least in part, the relative priorities in association with table indices that are associated with the at least one portion of the incoming packet data;
    at least one other of the multiple table data partitions is configurable to comprise the multiple entries;
    the table data is configurable to indicate packet processing rules that comprise the at least one action;
    the packet processing rules are configurable to indicate:
      at least one packet drop;
      at least one next packet hop determination; and/or
      at least one forwarding port determination; and
    the table indices are configurable to correspond, at least in part, to tree nodes.

2. The integrated circuit of claim 1, wherein:
the parallel table lookup operations involve two or more of the multiple table data partitions.

3. The integrated circuit of claim 2, wherein:
an application specific integrated circuit comprises the integrated circuit.

4. The integrated circuit of claim 3, wherein:
the other machine-readable memory comprises programmable memory; and
the at least one processing unit comprises one or more processors.

5. The integrated circuit of claim 4, wherein:
at least one additional of the multiple table data partitions is configurable to indicate respective mask data associated with respective entries; and
the respective mask data is to be applied to certain portions of the incoming packet data.

6. The integrated circuit of claim 5, wherein:
another integrated circuit comprises the machine-readable TCAM.

7. Machine-readable instructions to be executed by an integrated circuit, the integrated circuit being for use in performing packet forwarding-related operations related to incoming packet data, the integrated circuit being configurable to use machine-readable tertiary content addressable memory (TCAM) in association with the packet forwarding-related operations, the integrated circuit comprising other machine-readable memory and at least one processing unit, the other machine-readable memory being for use in the packet forwarding-related operations, the machine-readable instructions, when executed by the integrated circuit, resulting in the integrated circuit being configured to perform certain operations comprising:
  storing, in the machine-readable TCAM and the other machine-readable memory, table data for use in the packet forwarding-related operations; and
  executing, by the at least one processing unit, compiler-produced program instructions, the compiler-produced program instructions, when executed by the at least one processing unit resulting in the integrated circuit being configured to perform the packet forwarding-related operations, the packet forwarding-related operations being configurable to comprise:
    performing parallel table lookup operations to determine multiple entries in the table data that match, at least in part, at least one portion of the incoming packet data;
    selecting, based upon relative priorities associated with the multiple entries, one of the multiple entries that corresponds to a highest one of the relative priorities; and
    based upon the one of the multiple entries, determining at least one action to be executed in relation to the incoming packet data;
    wherein:
      the table data is configurable to comprise multiple table data partitions;
      at least one of the multiple table data partitions is configurable to indicate, at least in part, the relative priorities in association with table indices that are associated with the at least one portion of the incoming packet data;
      at least one other of the multiple table data partitions is configurable to comprise the multiple entries;
      the table data is configurable to indicate packet processing rules that comprise the at least one action;
      the packet processing rules are configurable to indicate:
        at least one packet drop;
        at least one next packet hop determination; and/or
        at least one forwarding port determination; and
      the table indices are configurable to correspond, at least in part, to tree nodes.

8. The machine-readable instructions of claim 7, wherein:
the parallel table lookup operations involve two or more of the multiple table data partitions.

9. The machine-readable instructions of claim 8, wherein:
an application specific integrated circuit comprises the integrated circuit.

10. The machine-readable instructions of claim 9, wherein:
the other machine-readable memory comprises programmable memory; and
the at least one processing unit comprises one or more processors.

11. The machine-readable instructions of claim 10, wherein:
at least one additional of the multiple table data partitions is configurable to indicate respective mask data associated with respective entries; and
the respective mask data is to be applied to certain portions of the incoming packet data.

12. The machine-readable instructions of claim 11, wherein:
another integrated circuit comprises the machine-readable TCAM.

13. A method implemented using an integrated circuit, the integrated circuit being for use in performing packet forwarding-related operations related to incoming packet data, the integrated circuit being configurable to use machine-readable tertiary content addressable memory (TCAM) in association with the packet forwarding-related operations, the integrated circuit comprising other machine-readable memory and at least one processing unit, the other machine-readable memory being for use in the packet forwarding-related operations, the method comprising:
- storing, in the machine-readable TCAM and the other machine-readable memory, table data for use in the packet forwarding-related operations; and
- executing, by the at least one processing unit, compiler-produced program instructions, the compiler-produced program instructions, when executed by the at least one processing unit resulting in the integrated circuit being configured to perform the packet forwarding-related operations, the packet forwarding-related operations being configurable to comprise:
  - performing parallel table lookup operations to determine multiple entries in the table data that match, at least in part, at least one portion of the incoming packet data;
  - selecting, based upon relative priorities associated with the multiple entries, one of the multiple entries that corresponds to a highest one of the relative priorities; and
  - based upon the one of the multiple entries, determining at least one action to be executed in relation to the incoming packet data;

wherein:
- the table data is configurable to comprise multiple table data partitions;
- at least one of the multiple table data partitions is configurable to indicate, at least in part, the relative priorities in association with table indices that are associated with the at least one portion of the incoming packet data;
- at least one other of the multiple table data partitions is configurable to comprise the multiple entries;
- the table data is configurable to indicate packet processing rules that comprise the at least one action;
- the packet processing rules are configurable to indicate:
  - at least one packet drop;
  - at least one next packet hop determination; and/or
  - at least one forwarding port determination; and
- the table indices are configurable to correspond, at least in part, to tree nodes.

14. The method of claim 13, wherein:
the parallel table lookup operations involve two or more of the multiple table data partitions.

15. The method of claim 14, wherein:
an application specific integrated circuit comprises the integrated circuit.

16. The method of claim 15, wherein:
the other machine-readable memory comprises programmable memory; and
the at least one processing unit comprises one or more processors.

17. The method of claim 16, wherein:
at least one additional of the multiple table data partitions is configurable to indicate respective mask data associated with respective entries; and
the respective mask data is to be applied to certain portions of the incoming packet data.

18. The method of claim 17, wherein:
another integrated circuit comprises the machine-readable TCAM.

19. A network switch for performing packet forwarding-related operations related to a network and incoming packet data to be received via the network, the network switch being configurable to use machine-readable tertiary content addressable memory (TCAM) in association with the packet forwarding-related operations, the network switch comprising:
- ports to be coupled to the network; and
- an integrated circuit coupled to the ports, the integrated circuit comprising:
  - other machine-readable memory for use in the packet forwarding-related operations, the machine-readable TCAM and the other machine-readable memory to store table data for use in the packet forwarding-related operations; and
  - at least one processing unit to execute compiler-produced program instructions, the compiler-produced program instructions, when executed by the at least one processing unit resulting in the integrated circuit being configured to perform the packet forwarding-related operations, the packet forwarding-related operations being configurable to comprise:
    - performing parallel table lookup operations to determine multiple entries in the table data that match, at least in part, at least one portion of the incoming packet data;
    - selecting, based upon relative priorities associated with the multiple entries, one of the multiple entries that corresponds to a highest one of the relative priorities; and
    - based upon the one of the multiple entries, determining at least one action to be executed in relation to the incoming packet data;

wherein:
- the table data is configurable to comprise multiple table data partitions;
- at least one of the multiple table data partitions is configurable to indicate, at least in part, the relative priorities in association with table indices that are associated with the at least one portion of the incoming packet data;
- at least one other of the multiple table data partitions is configurable to comprise the multiple entries;
- the table data is configurable to indicate packet processing rules that comprise the at least one action;
- the packet processing rules are configurable to indicate:
  - at least one packet drop;
  - at least one next packet hop determination; and/or
  - at least one forwarding port determination; and
- the table indices are configurable to correspond, at least in part, to tree nodes.

20. The network switch of claim 19, wherein:
the parallel table lookup operations involve two or more of the multiple table data partitions.

21. The network switch of claim 20, wherein:
an application specific integrated circuit comprises the integrated circuit.

22. The network switch of claim 21, wherein:
the other machine-readable memory comprises programmable memory; and
the at least one processing unit comprises one or more processors.

23. The network switch of claim 22, wherein:
at least one additional of the multiple table data partitions is configurable to indicate respective mask data associated with respective entries; and
the respective mask data is to be applied to certain portions of the incoming packet data.

24. The network switch of claim 23, wherein:
another integrated circuit comprises the machine-readable TCAM.

\* \* \* \* \*